United States Patent
Lee et al.

(10) Patent No.: US 8,653,609 B2
(45) Date of Patent: Feb. 18, 2014

(54) FINFET DESIGN WITH REDUCED CURRENT CROWDING

(71) Applicant: Taiwan Semiconductor Manufacturing Company, Ltd., Hsin-Chu (TW)

(72) Inventors: Tsung-Lin Lee, Hsin-Chu (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/912,912

(22) Filed: Jun. 7, 2013

(65) Prior Publication Data

US 2013/0270639 A1    Oct. 17, 2013

Related U.S. Application Data

(62) Division of application No. 12/842,281, filed on Jul. 23, 2010.

(60) Provisional application No. 61/255,393, filed on Oct. 27, 2009.

(51) Int. Cl.
H01L 27/088    (2006.01)

(52) U.S. Cl.
USPC ..... 257/401; 257/328; 257/331; 257/E29.255

(58) Field of Classification Search
USPC ................. 257/401, 328, 329, 331, 412, 413, 257/E29.255

See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0181477 A1 | 7/2009 | King et al. | |
| 2010/0276761 A1 | 11/2010 | Tung et al. | |
| 2011/0095378 A1* | 4/2011 | Lee et al. | 257/401 |

* cited by examiner

*Primary Examiner* — Jack Chen
(74) *Attorney, Agent, or Firm* — Slater & Matsil, L.L.P.

(57) ABSTRACT

An integrated circuit structure includes an integrated circuit structure includes a substrate, insulation regions over the substrate, and a fin field-effect transistor (FinFET). The FinFET includes a plurality of fins over the substrate, wherein each of the plurality of fins comprises a first fin portion and a second fin portion, a gate stack on a top surface and sidewalls of the first fin portion of each of the plurality of fins, an epitaxial semiconductor layer comprising a portion directly over the second fin portion of each of the plurality of fins, and sidewall portions directly over the insulation regions, and a silicide layer on, and having an interface with, the epitaxial layer, wherein a peripheral ratio of a total length of an effective silicide peripheral of the FinFET to a total length of peripherals of the plurality of fins is greater than 1.

20 Claims, 12 Drawing Sheets

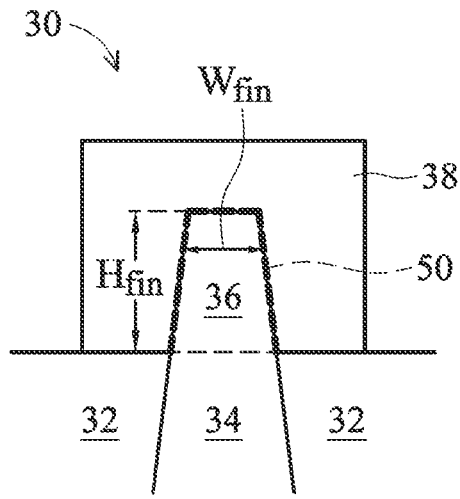
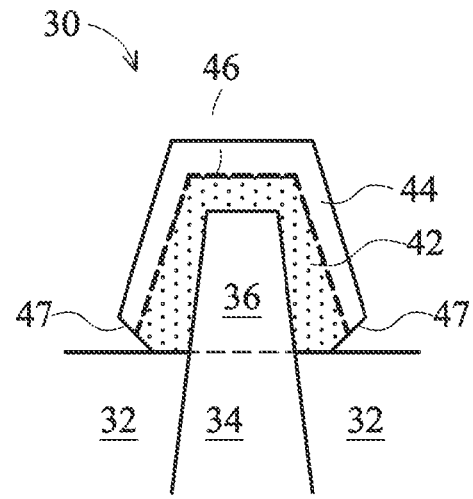
FIG. 2C    FIG. 2D
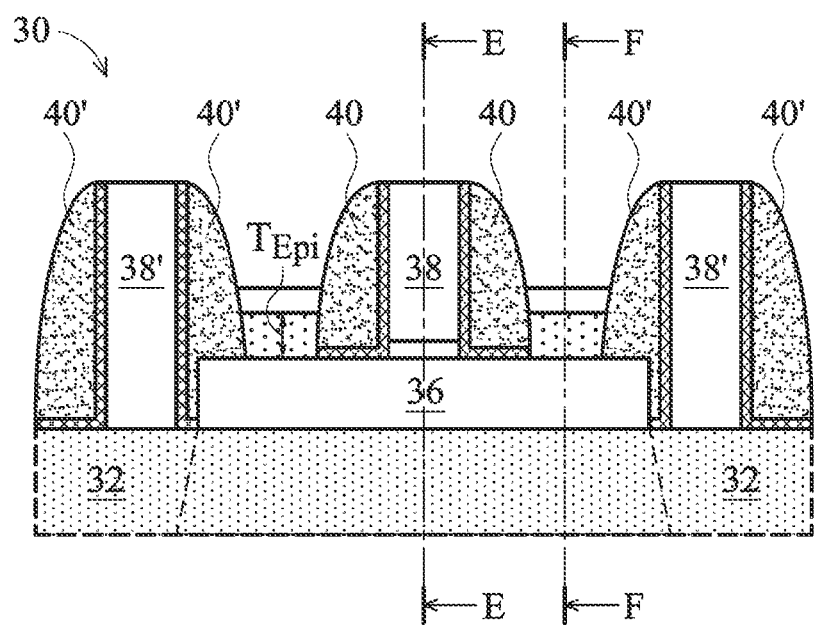
FIG. 2E

FINFET DESIGN WITH REDUCED CURRENT CROWDING

CROSS-REFERENCE TO RELATED APPLICATIONS

This application is a divisional of U.S. patent application Ser. No. 12/842,281 filed on Jul. 23, 2010, entitled "FinFET Design with Reduced Current Crowding," which claims the benefit of U.S. Provisional Application No. 61/255,393 filed on Oct. 27, 2009, entitled "FinFET Design with Reduced Current Crowding," which applications are hereby incorporated herein by reference.

TECHNICAL FIELD

This application relates generally to integrated circuit devices, and more particularly to fin field-effect transistors (FinFET).

BACKGROUND

With the increasing down scaling of integrated circuits and increasingly higher requirements for integrated circuits, transistors need to have higher drive currents with increasingly smaller dimensions. Fin field-effect transistors (FinFET) were thus developed. The FinFETs have increased channel widths, which channels include the portions formed on the sidewalls of the fins and the portions on the top surface of the fins. Since the drive currents of transistors are proportional to the channel widths, the drive currents are increased.

Similar to a planar transistor, source and drain silicides may be formed on the source and drain regions of FinFETs. FIG. 1 illustrates a cross-sectional view of a source/drain region of a FinFET. The source/drain region includes fin 20, epitaxial semiconductor regions 22, and silicide layer 24. It is noted that silicide layer 24 is mainly formed on the top of fin 20 and epitaxial semiconductor regions 22, and thickness T1 of the portion of silicide layer 24 on the top of fin 20 and epitaxial semiconductor regions 22 is significantly greater than thickness T2 on the sidewalls of epitaxial semiconductor regions 22. Some portions of the sidewalls of epitaxial semiconductor regions 22 may even be substantially free from silicide layer 24. Such a profile may adversely cause the increase in current crowding. Further, the effective source/drain resistance is also increased.

SUMMARY

In accordance with one aspect of the embodiment, an integrated circuit structure includes a substrate, insulation regions over the substrate, and a fin field-effect transistor (FinFET). The FinFET includes a plurality of fins over the substrate, wherein each of the plurality of fins comprises a first fin portion and a second fin portion, a gate stack on a top surface and sidewalls of the first fin portion of each of the plurality of fins, an epitaxial semiconductor layer comprising a portion directly over the second fin portion of each of the plurality of fins, and sidewall portions directly over the insulation regions, and a silicide layer on, and having an interface with, the epitaxial layer, wherein a peripheral ratio of a total length of an effective silicide peripheral of the FinFET to a total length of peripherals of the plurality of fins is greater than 1.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A through 2E illustrate a perspective view and cross-sectional views of a FinFET in accordance with an embodiment;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Novel fin field-effect transistor(s) (FinFET) and the method of forming the same are provided. The variations of the embodiments are discussed. Throughout the various views and illustrative embodiments, like reference numbers are used to designate like elements.

Figure 1:
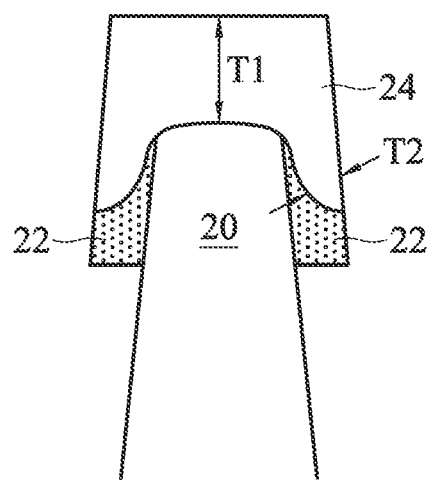
FIG. 1 illustrates the cross-sectional view of a source/drain region of a conventional fin field-effect transistor (FinFET)
Figure 2A:
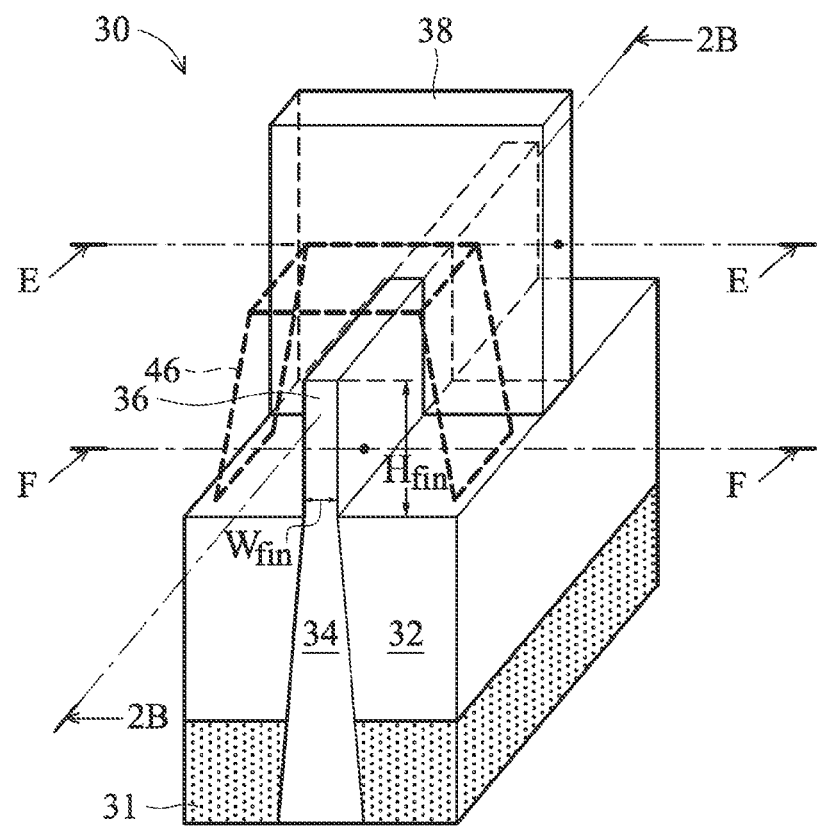

FIG. 2A illustrates a perspective view of FinFET 30, which includes fin 36, and gate stack 38 on the top surface and the sidewalls of fin 36. For simplicity, gate spacers 40, epitaxial layer 42 (which is a semiconductor layer), and silicide layer 44 (not shown in FIG. 2A, please refer to FIG. 2B) are not shown. However, the interface between epitaxial layer 42 and silicide layer 44 is schematically shown as dotted lines 46. The width of fin 36 is denoted as $W_{fin}$, and the height of fin 36 is denoted as $H_{fin}$.

Fin 36 may be directly over, and may form a continuous region with, semiconductor strip 34, which is between, and adjoins, shallow trench isolation (STI) regions 32. Semiconductor substrate 31, which may be formed of a same material as semiconductor strip 34 and fin 36, is under STI regions 32 and semiconductor strip 34. Fin 36 may be formed of a semiconductor material such as silicon, silicon germanium, and the like.

Figure 2B:
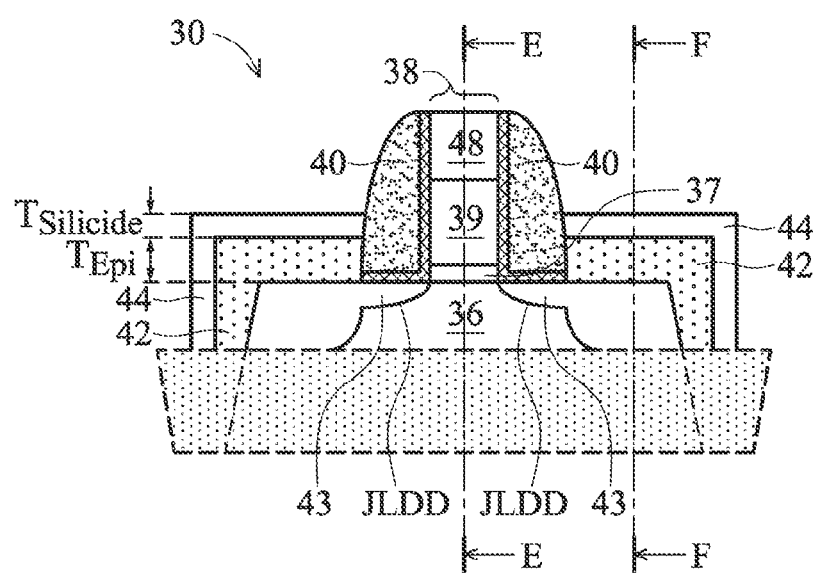

FIG. 2B illustrates a cross-sectional view of the structure shown in FIG. 2A, wherein the cross-sectional view is obtained from the vertical plane crossing line 2B-2B in FIG. 2A. Junctions JLDD, which may be the junctions between source/drain extension regions 43 and the underlying well region (not shown) in fin 36, are formed. Epitaxial layer 42 is formed on the exposed portion of fin 36 not covered by gate stack 38 and gate spacers 40. Gate stack 38 includes gate dielectric 37 and gate electrode 39. Further, gate silicide 48 may be formed on the top surface of gate stack 38. Epitaxial layer 42 may be formed of the same material as that of fin 36, or a material having a lattice constant different from that of fin 36. In an embodiment, fin 36 is formed of silicon, while epitaxial layer 42 may be formed of silicon, silicon germanium, silicon carbon, or the like. Silicide layer 44 has thickness $T_{silicide}$, which is measured at the portion of silicide layer 44 directly over fin 36. Further, epitaxial layer 42 has thickness $T_{Epi}$, which is also measured from the portion of epitaxial layer 42 directly over fin 36. In an embodiment, after the formation of silicide layer 44, there is still a portion of epitaxial layer 42 remaining between and contacting silicide layer 44 and fin 36, wherein the remaining portion of epitaxial layer 42 is directly over fin 36. Similarly, on the sidewalls of fin 36, there may also be epitaxial layer 42 remaining. It is to be noted that even if epitaxial layer 42 is formed of a same material as fin 36, the sidewall portions of epitaxial layer 42 that are on the sidewalls of fin 36 can still be distinguished from fin 36. The reason is that, as shown in FIG. 2D, the sidewall portions of epitaxial layer 42 are directly over STI regions 32, while fin 36 is directly over semiconductor strip 34.

FIG. 2C illustrates a cross-sectional view of the structure as shown in FIG. 2A, wherein the cross-sectional view is obtained from the vertical plane crossing line E-E in FIGS. 2A and 2B. It is noted that fin 36 has a peripheral as illustrated using dotted line 50. Fin peripheral 50 includes a top portion and two sidewall portions. In an embodiment wherein the sidewalls of fin 36 are substantially vertical, the length of fin peripheral 50 (referred to as fin peripheral length hereinafter) may be expressed as $W_{fin}+2H_{fin}$.

FIG. 2D illustrates a cross-sectional view of the structure as shown in FIG. 2A, wherein the cross-sectional view is obtained from the vertical plane crossing line F-F in FIGS. 2A and 2B. Effective silicide peripheral 46 is schematically illustrated using a dotted line. Throughout the description, the term "effective silicide peripheral" refers to the portion of the interface between epitaxial layer 42 and the overlying silicide layer 44. However, if a portion of the interface is substantially not contributing to passing current, the portion will not be considered as being a portion of the effective silicide peripheral, while the portions of the interface contributing to passing currents are considered as parts of the effective silicide peripheral. In the embodiment illustrated in FIG. 2D, effective silicide peripheral 46 includes essentially the entire interface between silicide layer 44 and epitaxial layer 42. It is noted that the bottom ends 47 of the sidewall portions of silicide layer 44 may be vertically spaced apart from the top surfaces of insulation regions 32. Accordingly, the length of effective silicide peripheral 46 may be greater than the fin peripheral length of fin peripheral 50.

FIG. 2E illustrates the cross-sectional view of an additional embodiment, wherein dummy gates 38' are formed adjacent to fin 36. The epitaxial growth of epitaxial layer 42 is performed after the formation of gate spacers 40. Therefore, unlike the embodiments shown in FIG. 2B, the ends of fin 36 (the sidewalls of fin 36 facing left and right in FIG. 2E) are blocked by dummy gates 38' and dummy gate spacers 40', and epitaxial layer 42 is not formed on the ends of fin 36. The cross-sectional views of the structure shown in FIG. 2E may also be illustrated using the cross-sectional views shown in FIGS. 2C and 2D.

Figure 3:
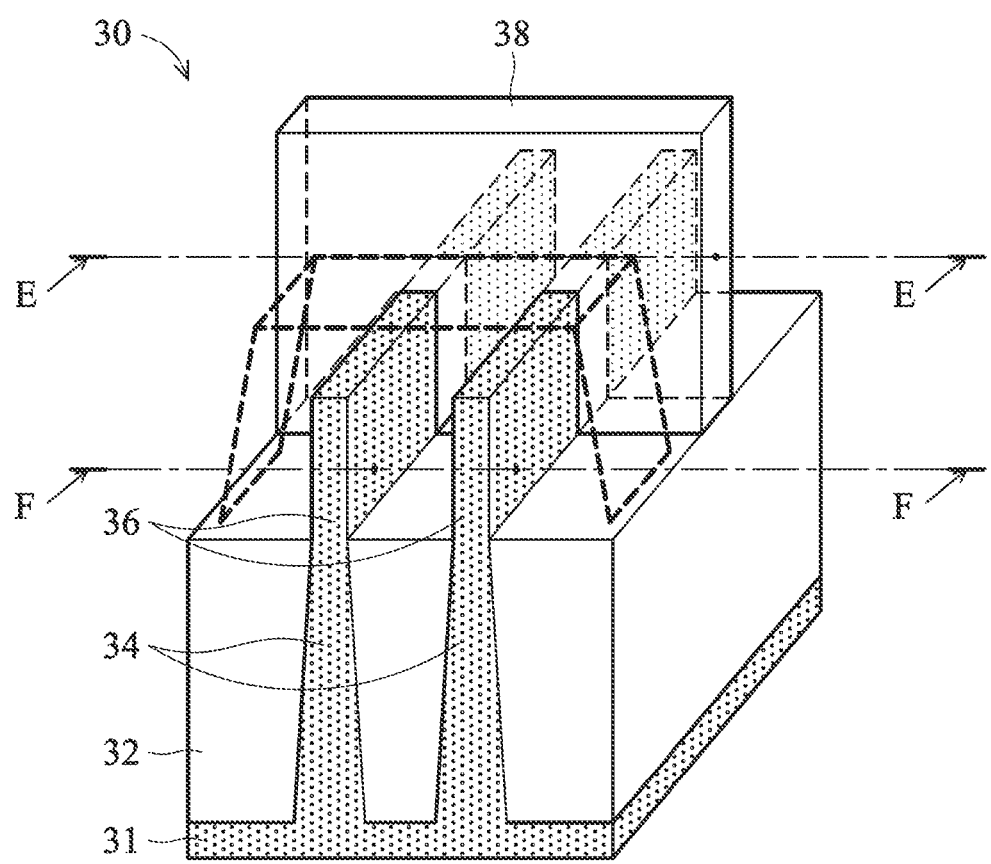
FIGS. 3 through 13 are perspective views and cross-sectional views of multi-fin FinFETs in accordance with another embodiment.
Figure 4:
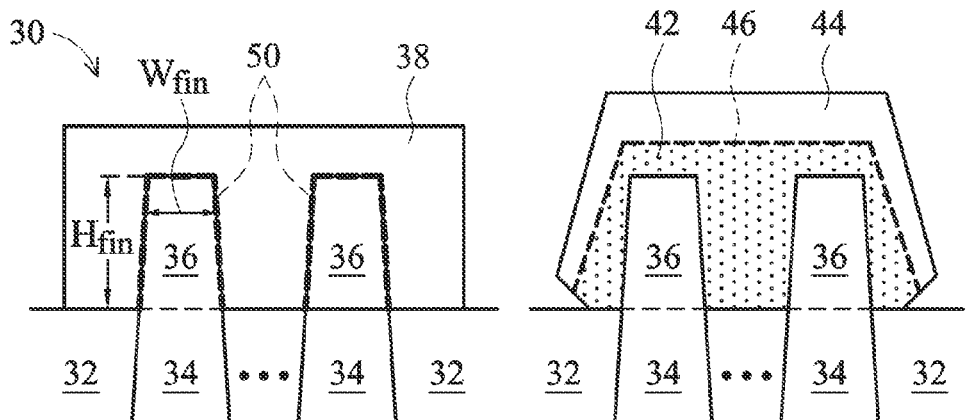
Figure 5:
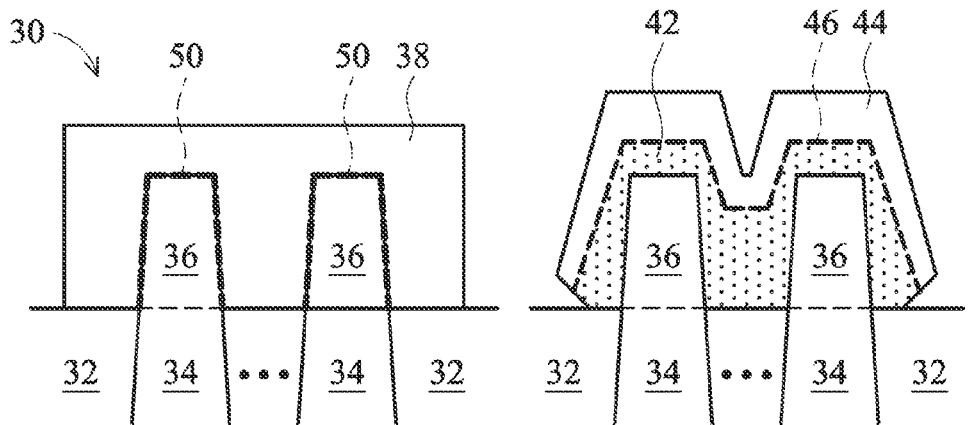
Figure 6:
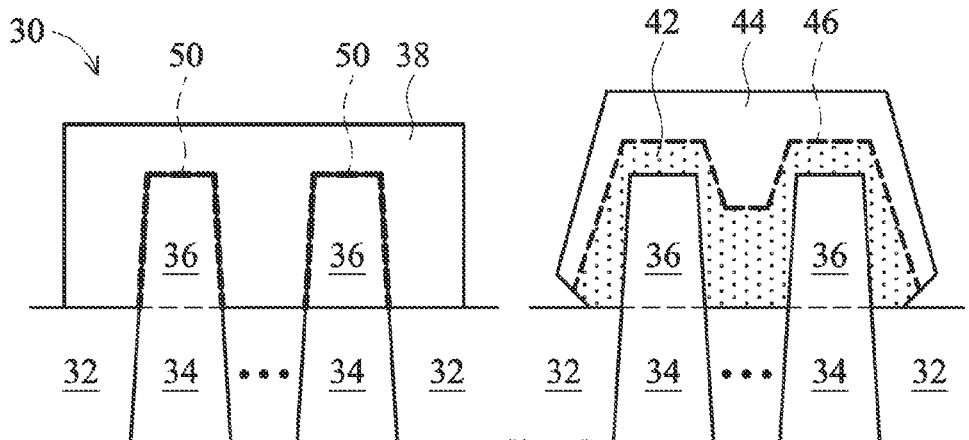

FIGS. 3 through 6 illustrate the cross-sectional views of variations of FinFETs. The respective effective silicide peripherals 46 and fin peripherals 50 are illustrated to explain the concept of the disclosure. FIG. 3 illustrates the perspective view of a multi-fin FinFET including a plurality of fins 36. For simplicity, gate spacers 40, epitaxial layer 42, and silicide layer 44 (FIGS. 4 through 12) are not shown in FIG. 3. However, the interface between epitaxial layer 42 and silicide layer 44 is schematically shown with dotted lines. In each of FIGS. 4 through 6, fin peripheral 50 and effective silicide peripheral 46 are illustrated as dotted lines. The left part of each of FIGS. 4 through 6 illustrates the cross-sectional view obtained from the vertical plane crossing line E-E in FIG. 3. The right part of each of FIGS. 4 through 6 illustrates the cross-sectional view obtained from the vertical plane crossing line F-F in FIG. 3.

Referring to FIG. 4, the cross-sectional views of a multi-fin FinFET is illustrated. Referring to the right side of FIG. 4, epitaxial layer 42 fully fills the gap between fins 36, and the top portion of the interface between epitaxial layer 42 and silicide layer 44 is substantially flat. Accordingly, the effective silicide peripheral 46, as illustrated using dotted lines, includes a top portion and two sidewall portions. The left side of FIG. 4 illustrates that fin peripheral 50 includes two portions, each including a top portion and two sidewall portions. The fin peripheral length is thus the sum of the top portion and the sidewall portions, and may be equal to $2W_{fin}+4H_{fin}$.

FIG. 5 illustrates an alternative embodiment similar to the embodiment illustrated in FIG. 4, except the top portion of effective silicide peripheral 46 is not flat. Rather, effective silicide peripheral 46 falls into (or toward) the gap between fins 36, as shown in the right part of FIG. 5. Fin peripheral 50, however, is still the same as shown in FIG. 4.

In FIG. 6, although the top surface of epitaxial layer 42 is not flat, the top surface of silicide layer 44 is flat. However, the shapes of fin peripheral 50 and effective silicide peripheral 46 are essentially the same as shown in FIG. 5. The calculation of the fin peripheral length and the silicide peripheral length in FIGS. 5 and 6 are also essentially the same.

FIGS. 7 through 12 illustrate multi-fin FinFETs comprising dummy fins. A perspective view of the FinFETs comprising dummy fins is illustrated in FIG. 13. Dummy fins 36' may be parallel to fins 36. However, dummy fins 36' do not have source and drain regions that extend directly under gate stack 38 and connect with each other, and hence do not form channel regions that can be controlled by gate stack 38. As dummy fins 36' are formed adjacent to fins 36, epitaxial layer 42 (FIGS. 7 through 12) will also be formed on the top surfaces and sidewalls of dummy fins 36'. A profile of the interface between silicide layer 44 and epitaxial layer 42 is also illustrated in FIG. 13 using dotted lines. Each of FIGS. 7 through 12 includes a left part and a right part. The left part of each of FIGS. 7 through 12 illustrates the cross-sectional view obtained from the vertical plane crossing line E-E in FIG. 13. The right part of each of FIGS. 7 through 12 illustrates the cross-sectional view obtained from the vertical plane crossing line F-F in FIG. 13.

Figure 7:
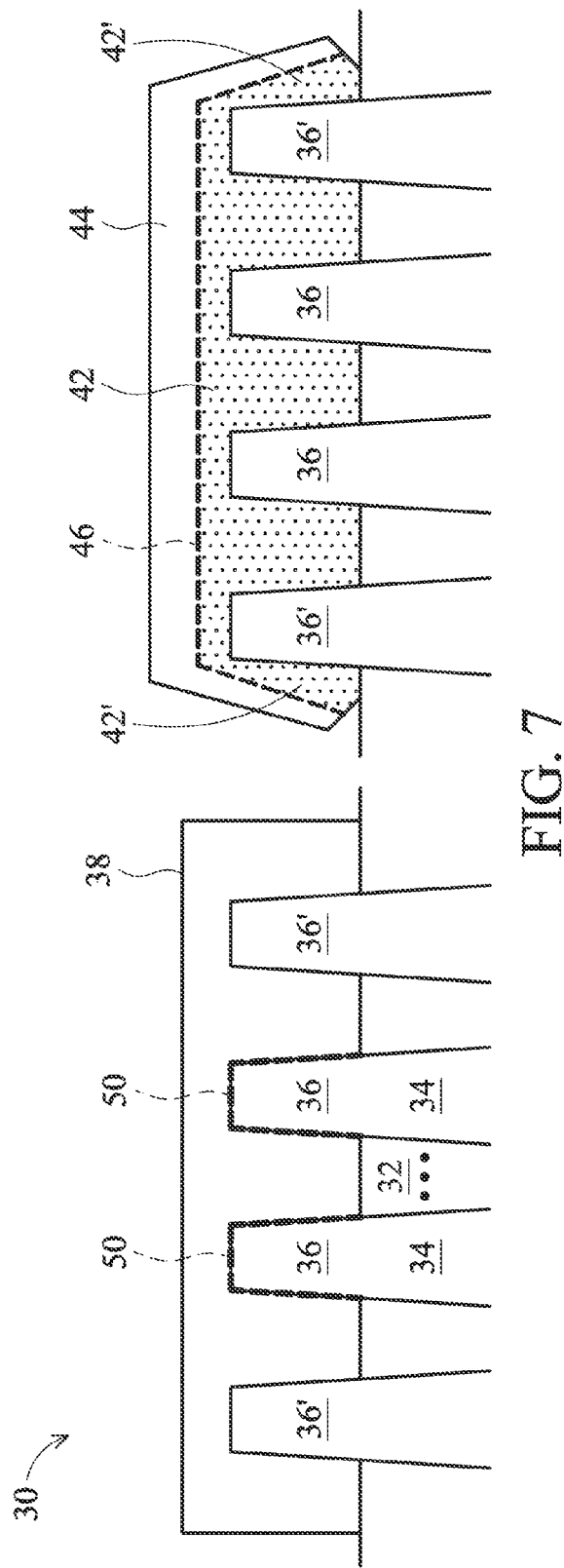

In an embodiment, as shown in FIG. 7, dummy fins 36' are formed on the opposite sides of fins 36. The lengthwise direction of dummy fins 36' may be parallel to the lengthwise direction of fins 36. Accordingly, as shown in the left part of FIG. 7, fin peripheral 50 includes the top surfaces and the sidewalls of fins 36, but does not include any portion of dummy fins 36'. On the other hand, referring to the right side of FIG. 7, since the portions of the silicide layer 44 on the sidewall portions 42' of epitaxial layer 42 has substantially no current flowing through due to the fact that no current channels connect the portions of dummy fins 36' on the source side and the portions of dummy fins 36' on the drain side, effective silicide peripheral 46 includes the top portion of the interface between silicide layer 44 and epitaxial layer 42, but does not include the sidewall portions of the interface (not marked with dotted lines).

Figure 8:
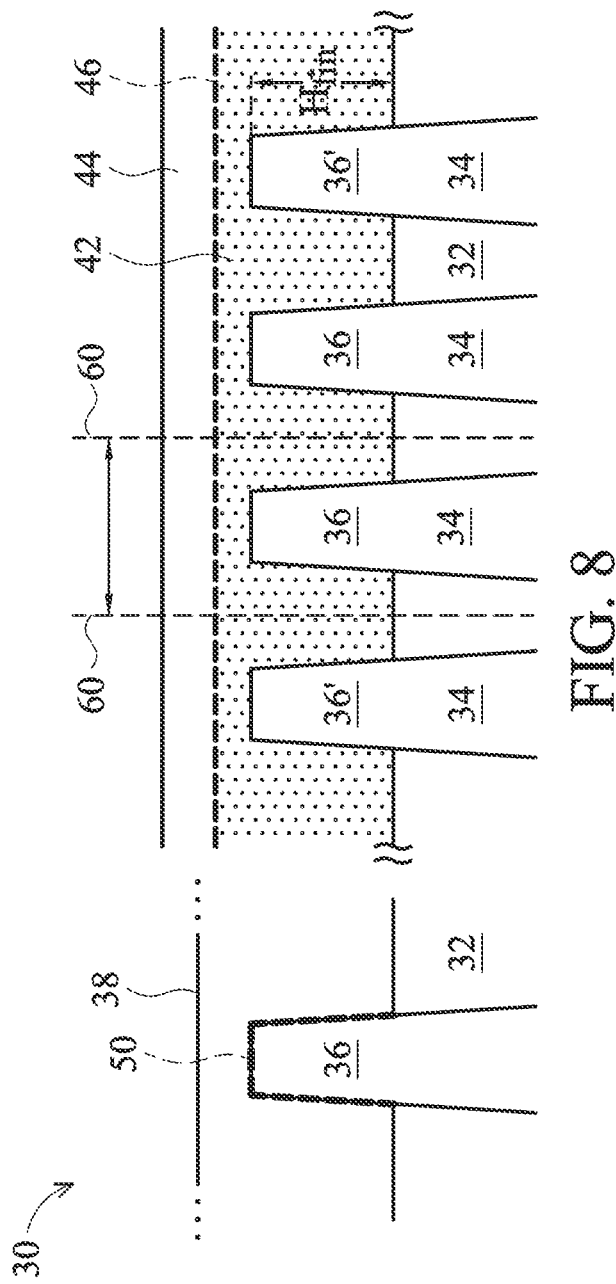

If the number of fins in the FinFET as shown in FIG. 7 is big enough, for example, greater than about 7, the structure in FIG. 7 may be considered as the repetition of the structure between middle lines 60 (FIG. 8), wherein middle lines 60 are the middle lines of neighboring fins 36. Accordingly, the peripheral ratio (as will be discussed in detail in subsequent paragraphs), which is the ratio of the total length of effective silicide peripheral 46 to the total length of fin peripheral 50, may be simplified as the ratio of the length of the silicide portion between two neighboring middle lines 60 to the fin peripheral of a single fin 36 (the left part of FIG. 8). Through FIG. 8, it can be realized that for the FinFET as shown in FIG. 8, in order to increase the peripheral ratio, the fin height $H_{fin}$ may need to be reduced.

Figure 9:
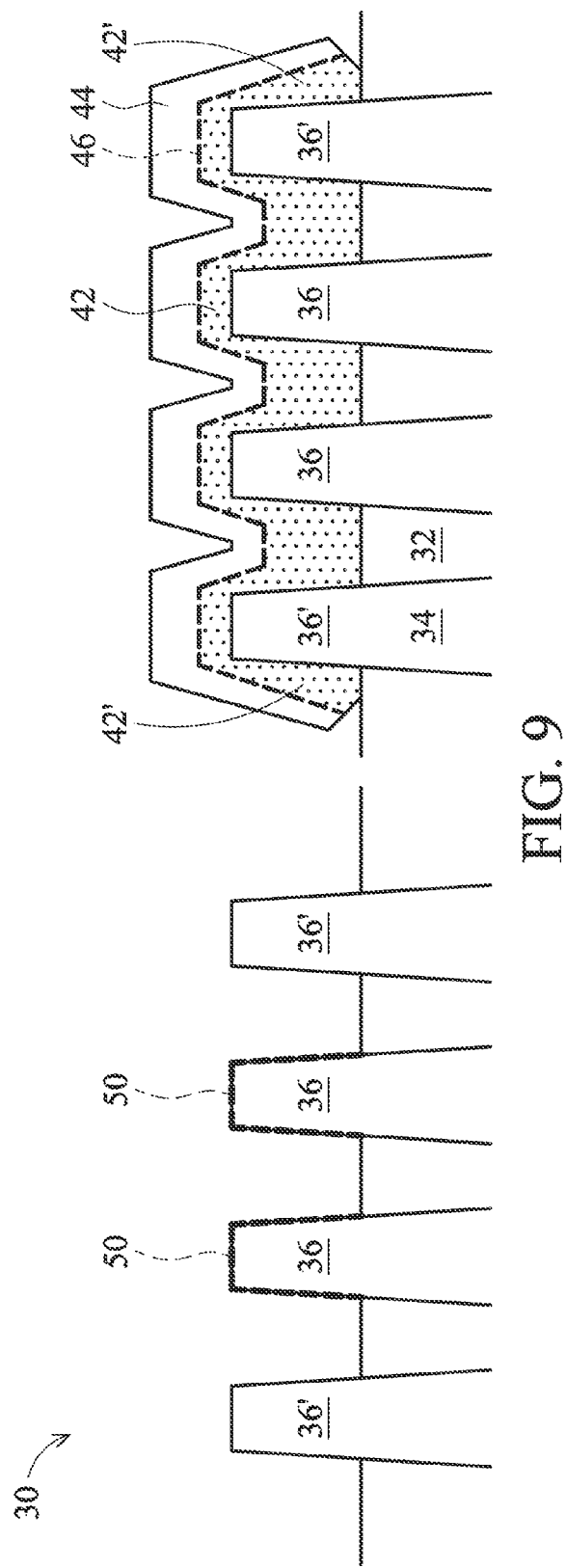

FIG. 9 illustrates an alternative embodiment. This embodiment is similar to the embodiment shown in FIG. 7, except that the top surfaces of epitaxial layer 42 and silicide layer 44 are not flat. Similar to the embodiment shown in FIG. 7, fin peripheral 50 includes the top surface and the sidewalls of fins 36, but does not include any portion of dummy fins 36'. Effective silicide peripheral 46 (marked with a dotted line) includes the top portion (which is not flat) of the interface between silicide layer 44 and epitaxial layer 42, but does not include the sidewall portions (not marked with dotted lines) of the interface that are on outer sides of dummy fins 36'. Throughout the description, the term "outer side" refers to the side of a dummy fin 36' facing away from fins 36.

Figure 10:
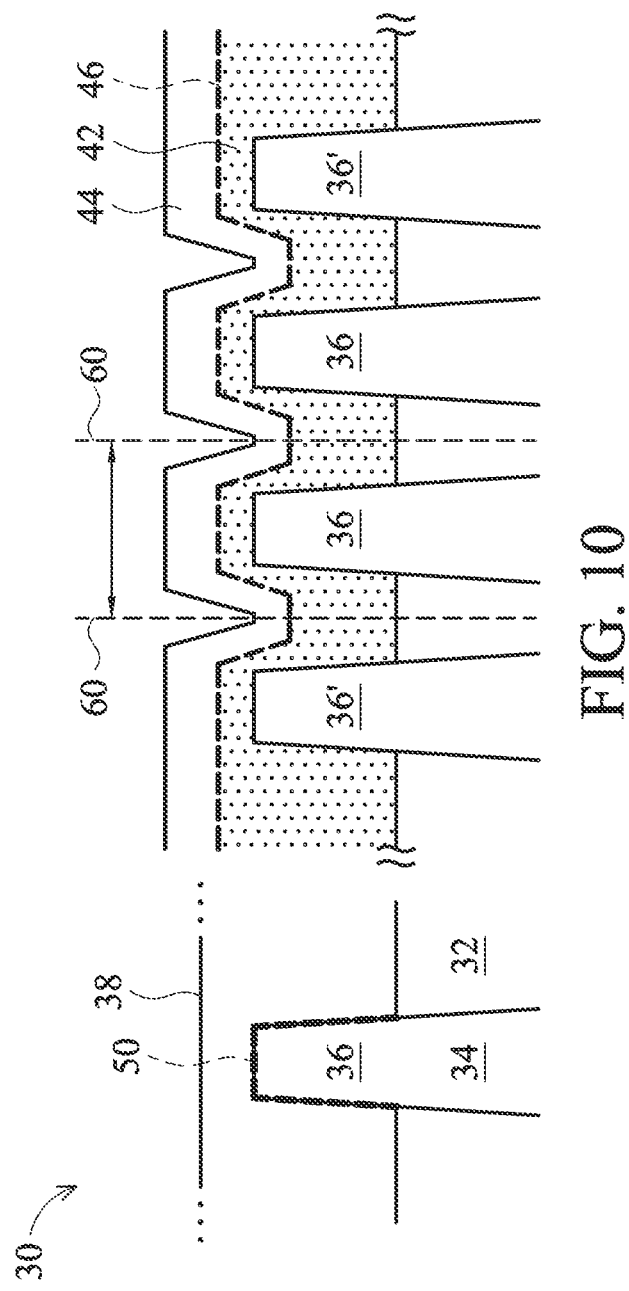

FIG. 10 illustrates the cross-sectional view of a multi-fin FinFET in accordance with yet another embodiment. Similar to the embodiment shown in FIG. 8, if the number of fins 36 in the FinFET as shown in FIG. 9 is big enough, for example, greater than about 7, then the calculation of the peripheral ratio (the ratio of the total length of effective silicide peripheral 46 to the total length of fin peripheral 50) may be simplified. As shown in FIG. 10, the peripheral ratio may be considered as being the length of the portion of effective silicide peripheral 46 between two neighboring middle lines 60 divided by the length of the fin peripheral of a single fin 36.

Figure 11:
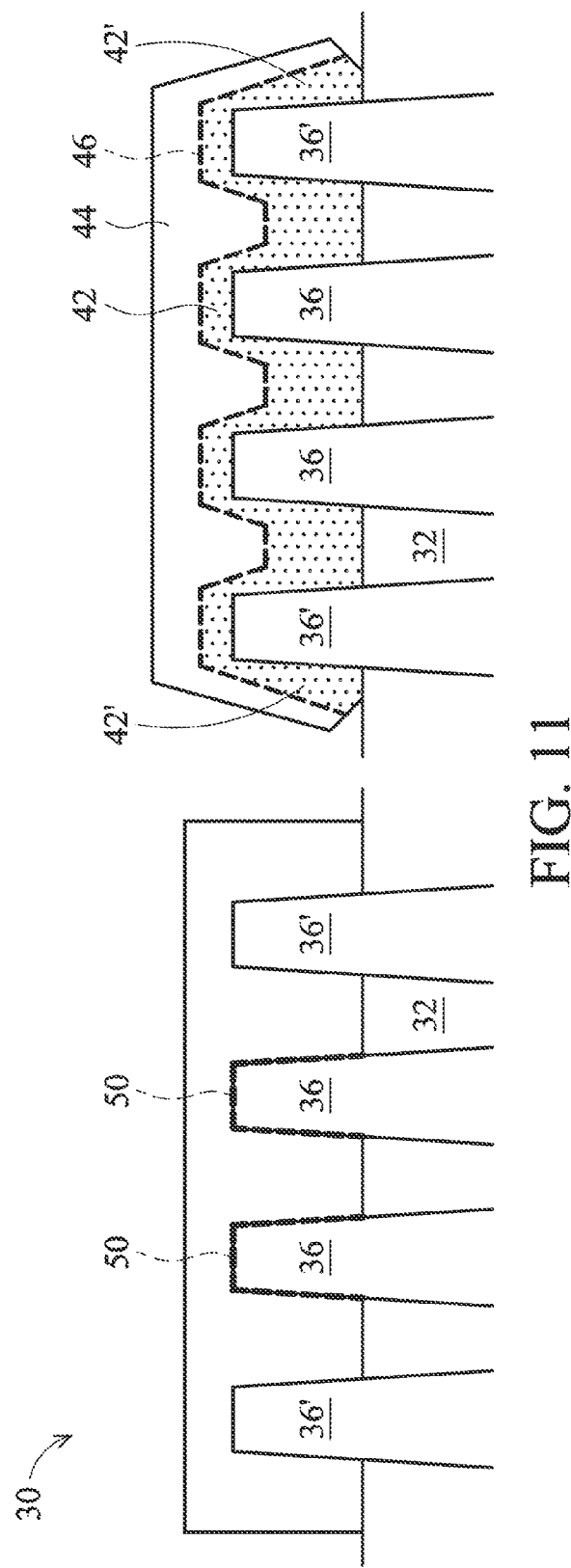
Figure 12:
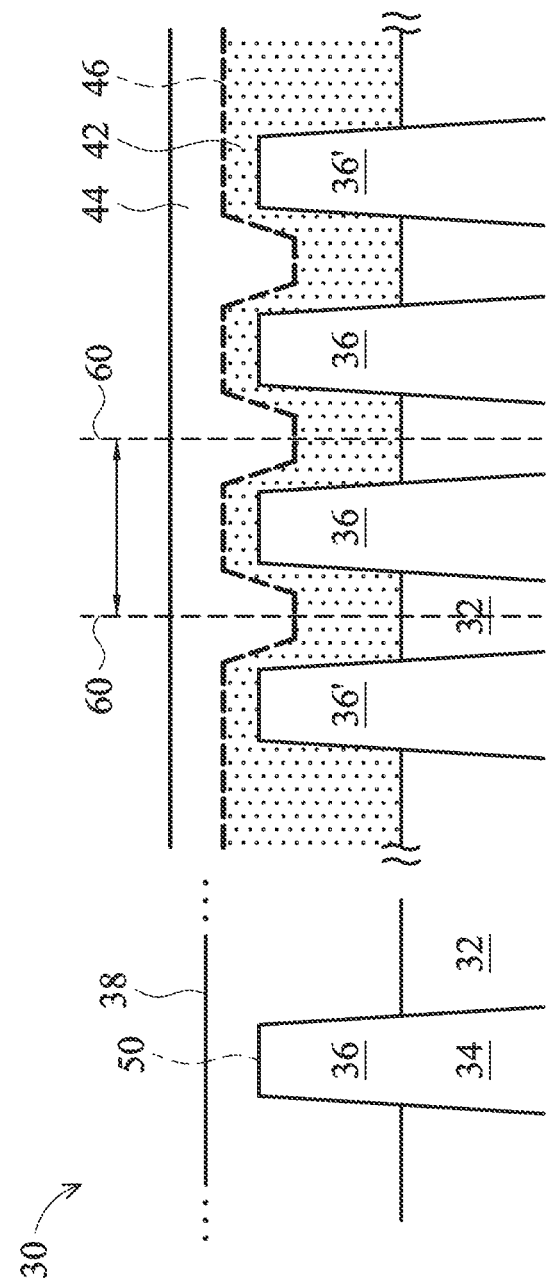
Figure 13:
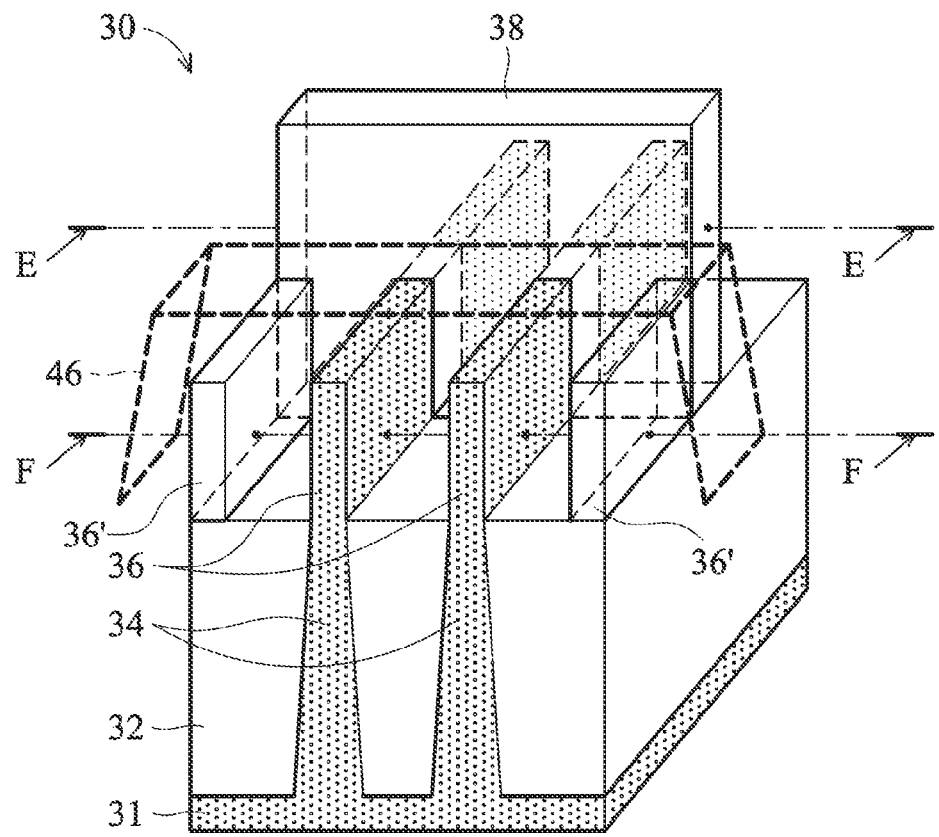

The embodiments illustrated in FIGS. 11 and 12 are similar to the embodiments shown in FIGS. 9 and 10, respectively, except the top surface of silicide layer 44 is not flat. This difference, however, does not result in the change in effective silicide peripheral 46 and fin peripheral 50, and the peripheral ratio may still be calculated as the length of effective silicide peripheral 46 to the length of fin peripheral 50.

In each of FIGS. 2A through 13, the peripheral ratio, which is the total length of fin peripheral 50 to the total length of effective silicide peripheral 46, is greater than 1, and may be greater than about 1.1, or even greater than about 1.4. With the peripheral ratio being greater than 1, the current flowing through fin(s) 36 may be spread to silicide layer 44 with a longer peripheral, and hence the current crowding in the effective silicide peripheral is reduced. Conversely, if the peripheral ratio is less than 1, current crowding will occur. Further, with the thickness $T_{Epi}$ (FIGS. 2B and 2E) being greater than 0 μm, or in other words, with remaining epitaxial layer 42 being directly over fin 36 and vertically between silicide layer 44 (FIGS. 2D and 4 through 12) and fin 36, the distances between silicide layer 44 and junctions JLDD (FIG. 2D) are increased.

Figure 14:
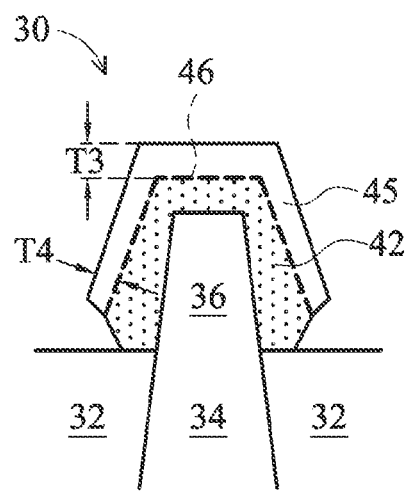
FIG. 14 illustrates a metal layer formed on an epitaxial semiconductor layer, which is further formed on a semiconductor fin.

To ensure the peripheral ratio to be greater than 1 and to ensure epitaxial layer 42 being directly over fin 36 and vertically between silicide layer 44 and fin 36, the formation process of silicide layer 44 needs to be tuned. For example, referring to FIG. 14, in order to form silicide layer 44, metal layer 45 is formed on the surface of epitaxial layer 42 first. An anneal is then performed to form the silicide. Metal layer 45 needs to be conformal, which means that the thickness T3 of the portion of metal layer 45 on the top of epitaxial layer 42 is substantially equal to thickness T4 of the portion of metal layer 45 on the sidewall portions of epitaxial layer 42. Accordingly, methods that may be used to form more conformal films such as atomic layer deposition (ALD) may be used. The formation of conformal metal layer 45 may also involve the optimization of the process conditions such as the temperature of the respective substrate and deposition rate. With the conformal metal layer 45, the resulting silicide layer 44 (FIGS. 1D and 4 through 12) may be more conformal. It is observed that with the conformal silicide formation, it is possible to increase the distance between silicide layer 44 and junctions JLDD (FIG. 2B) while still keeping a high peripheral ratio.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a substrate;
insulation regions over the substrate; and
a fin field-effect transistor (FinFET) comprising:
    a plurality of fins over the substrate, wherein each of the plurality of fins comprises a first fin portion and a second fin portion;
    a gate stack on a top surface and sidewalls of the first fin portion of each of the plurality of fins;
    an epitaxial semiconductor layer comprising a portion directly over the second fin portion of each of the plurality of fins, and sidewall portions directly over the insulation regions;
    a silicide layer on, and having an interface with, the epitaxial layer, wherein a peripheral ratio of a total length of an effective silicide peripheral of the FinFET to a total length of peripherals of the plurality of fins is greater than 1; and
    a dummy fin, wherein the epitaxial semiconductor layer extends on a top surface and sidewalls of the dummy fin, and wherein the effective silicide peripheral does not comprise any sidewall portion on outer sides of the dummy fin.

2. The integrated circuit structure of claim 1, wherein the peripheral ratio is greater than about 1.1.

3. The integrated circuit structure of claim 1, wherein the effective silicide peripheral comprises sidewall portions on outer sidewalls of the plurality of fins.

4. The integrated circuit structure of claim 1, further comprising a dummy fin, wherein the epitaxial semiconductor layer extends on a top surface and sidewalls of the dummy fin, and wherein the effective silicide peripheral comprises no sidewall portion on an outer side of the dummy fin.

5. The integrated circuit structure of claim 1, wherein a top portion of the effective silicide peripheral over the plurality of fins is substantially flat.

6. The integrated circuit structure of claim 1, wherein a top portion of the effective silicide peripheral over the plurality of fins is not flat.

7. The integrated circuit structure of claim 1, wherein a top surface of the silicide layer is flat.

8. An integrated circuit structure comprising:
a substrate;
insulation regions over the substrate; and
a fin field-effect transistor (FinFET) comprising:
   a plurality of fins over the substrate, wherein each of the plurality of fins comprises a first fin portion and a second fin portion;
   a gate stack on a top surface and sidewalls of the first fin portion of each of the plurality of fins;
   an epitaxial semiconductor layer comprising a portion directly over the second fin portion of each of the plurality of fins, and sidewall portions directly over the insulation regions;
   a silicide layer on, and having an interface with, the epitaxial layer, wherein a peripheral ratio of a total length of an effective silicide peripheral of the FinFET to a total length of peripherals of the plurality of fins is greater than 1, and wherein the effective silicide peripheral and the fin peripheral each have a different cross sectional profile shape at a same position along a length of the plurality of fins; and
   a dummy fin covered by the epitaxial semiconductor layer, and wherein outer sidewall portions from the dummy fin do not contribute to an effective silicide peripheral of the FinFET.

9. The integrated circuit structure of claim 8, wherein the peripheral ratio is greater than about 1.1.

10. The integrated circuit structure of claim 8, wherein the effective silicide peripheral comprises sidewall portions on outer sidewalls of the plurality of fins.

11. The integrated circuit structure of claim 8, further comprising a dummy fin, wherein the epitaxial semiconductor layer extends on a top surface and sidewalls of the dummy fin, and wherein the effective silicide peripheral comprises no sidewall portion on an outer side of the dummy fin.

12. The integrated circuit structure of claim 8, wherein a top portion of the effective silicide peripheral over the plurality of fins is substantially flat.

13. The integrated circuit structure of claim 8, wherein a top portion of the effective silicide peripheral over the plurality of fins is not flat.

14. The integrated circuit structure of claim 8, wherein a top surface of the silicide layer is flat.

15. An integrated circuit structure comprising:
a substrate;
insulation regions over the substrate; and
a fin field-effect transistor (FinFET) comprising:
   a plurality of fins over the substrate, wherein each of the plurality of fins comprises a first fin portion and a second fin portion;
   a gate stack on a top surface and sidewalls of the first fin portion of each of the plurality of fins;
   an epitaxial semiconductor layer comprising a portion directly over the second fin portion of each of the plurality of fins, and sidewall portions directly over the insulation regions;
   a silicide layer on, and having an interface with, the epitaxial layer, wherein a peripheral ratio of a total length of an effective silicide peripheral of the FinFET to a total length of peripherals of the plurality of fins is greater than 1, and wherein the effective silicide peripheral and the fin peripheral each have a different cross sectional profile shape in a same plane; and
   a dummy fin covered by the epitaxial semiconductor layer, and wherein outer sidewall portions from the dummy fin do not contribute to an effective silicide peripheral of the FinFET.

16. The integrated circuit structure of claim 15, wherein the peripheral ratio is greater than about 1.1.

17. The integrated circuit structure of claim 15, wherein the peripheral ratio is between about 1.1 and 1.4.

18. The integrated circuit structure of claim 15, wherein a top portion of the effective silicide peripheral over the plurality of fins is substantially flat.

19. The integrated circuit structure of claim 15, wherein a top portion of the effective silicide peripheral over the plurality of fins is not flat.

20. The integrated circuit structure of claim 15, wherein the silicide layer is conformal.

* * * * *